(12) United States Patent
Chinda et al.

(10) Patent No.: US 7,268,408 B2
(45) Date of Patent: Sep. 11, 2007

(54) WIRING BOARD, METHOD FOR MANUFACTURING WIRING BOARD AND ELECTRONIC COMPONENT USING WIRING BOARD

(75) Inventors: Akira Chinda, Tokyo (JP); Akira Matsuura, Tokyo (JP); Takayuki Yoshiwa, Tokyo (JP); Mamoru Mita, Tokyo (JP); Takashi Kageyama, Tokyo (JP); Katsutoshi Taga, Tokyo (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 10/348,478

(22) Filed: Jan. 21, 2003

(65) Prior Publication Data

US 2003/0178713 A1   Sep. 25, 2003

(30) Foreign Application Priority Data

Jan. 21, 2002   (JP) .............................. 2002-011301
Aug. 28, 2002  (JP) .............................. 2002-248829

(51) Int. Cl.
     *H01L 29/00*   (2006.01)
(52) U.S. Cl. ....................... 257/528; 257/693; 257/698; 257/774
(58) Field of Classification Search ..................... None
     See application file for complete search history.

(56) References Cited

U.S. PATENT DOCUMENTS

| | | | |
|---|---|---|---|
| 5,177,670 A * | 1/1993 | Shinohara et al. ........... | 361/738 |
| 6,228,466 B1 * | 5/2001 | Tsukada et al. .............. | 428/209 |
| 6,498,714 B1 * | 12/2002 | Fujisawa et al. .......... | 361/306.3 |
| 6,509,530 B2 * | 1/2003 | Pearson et al. .............. | 174/260 |
| 6,548,972 B2 * | 4/2003 | Takagi ........................ | 318/293 |
| 6,586,835 B1 * | 7/2003 | Ahn et al. ................... | 257/717 |
| 6,617,681 B1 * | 9/2003 | Bohr ........................... | 257/700 |
| 6,670,718 B2 * | 12/2003 | Chinda et al. ............... | 257/774 |
| 6,710,263 B2 * | 3/2004 | Kobayashi et al. .......... | 174/260 |

FOREIGN PATENT DOCUMENTS

| | | |
|---|---|---|
| JP | 05-55539 | 7/1993 |
| JP | 08-107161 | 4/1996 |
| JP | 2000-182871 | 6/2000 |
| JP | 2001-267181 | 9/2001 |
| JP | 2001-307923 | 11/2001 |
| JP | 2002-043710 | 2/2002 |
| JP | 2000-189768 | 11/2002 |

OTHER PUBLICATIONS

Notification of Reasons for Refusal for counterpart Japanese Patent Application No. 2002-248829, mailed on Oct. 17, 2006.

* cited by examiner

*Primary Examiner*—Evan Pert
*Assistant Examiner*—Victor A. Mandala, Jr.
(74) *Attorney, Agent, or Firm*—James Conte; Barnes & Thornburg

(57) ABSTRACT

A wiring board which can realize a small and thin passive component such as solid condenser, resistor, coil, transistor or so on is provided. A wiring board which forms an electronic component by mounting a passive element, comprising an insulating board provided with an opening having predetermined pattern, a wiring formed with predetermined pattern on said insulating board, and an external terminal filled to said opening, connected with said wiring by said filling, and exposed to a bottom of said insulating board where said wiring is formed.

16 Claims, 7 Drawing Sheets

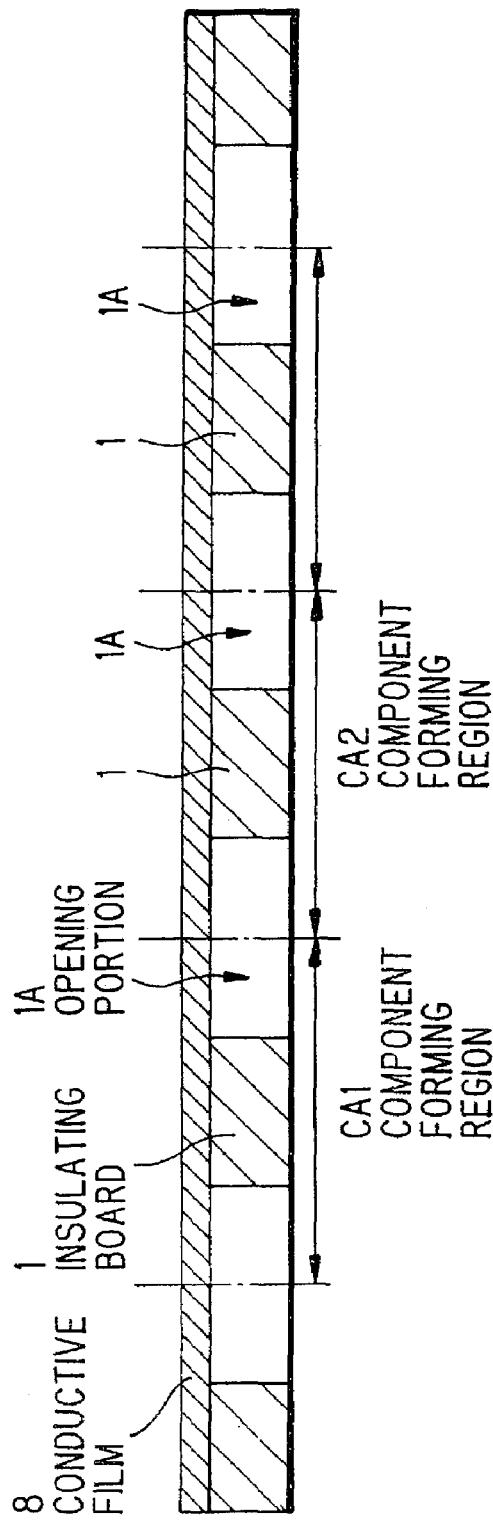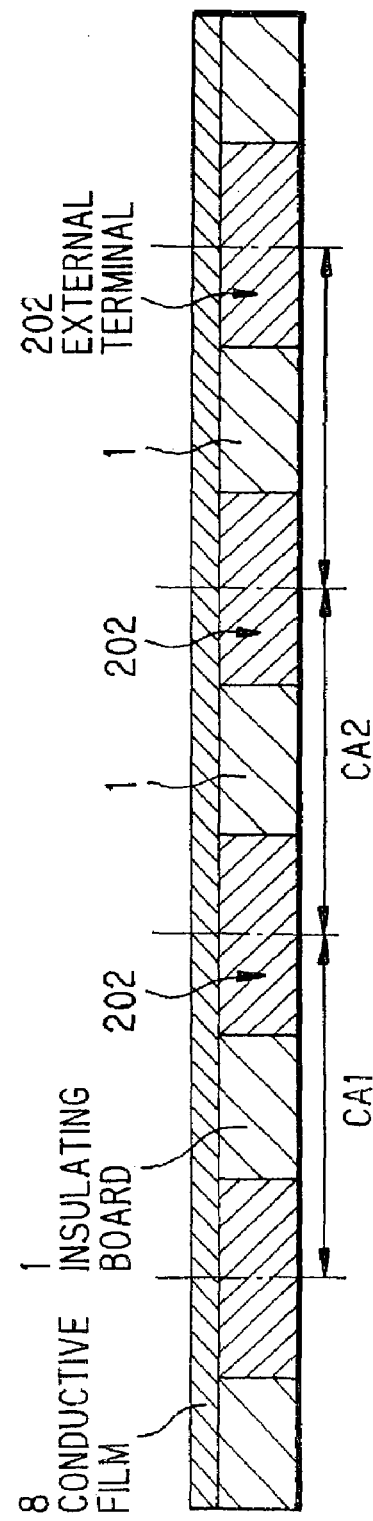

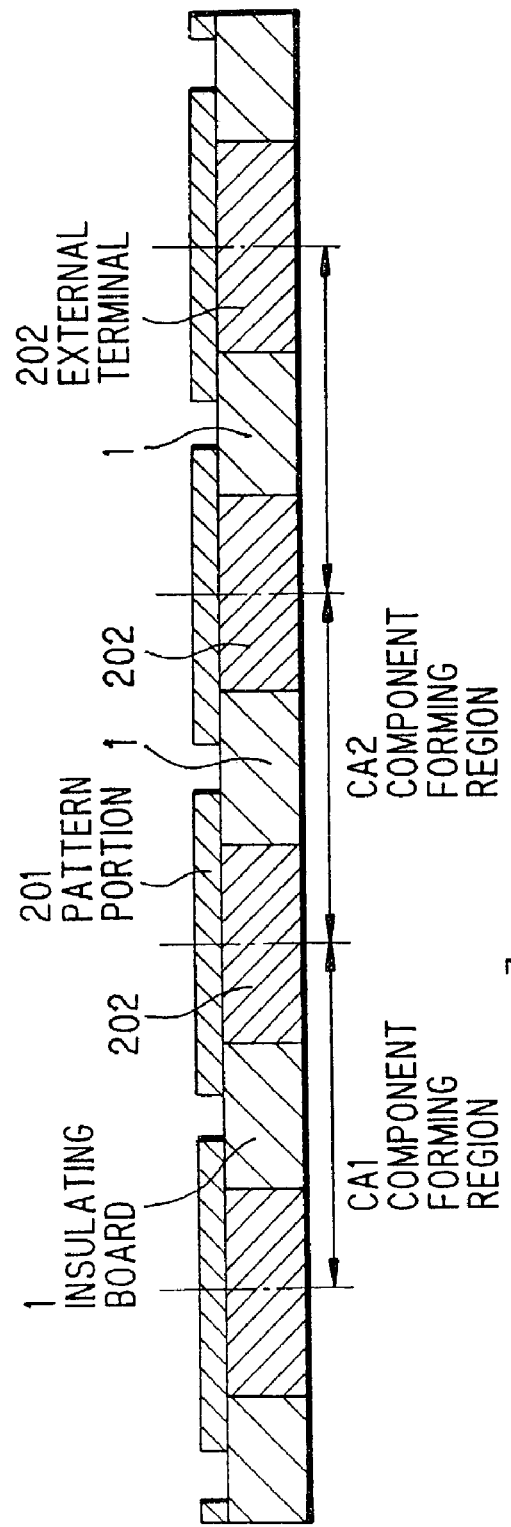
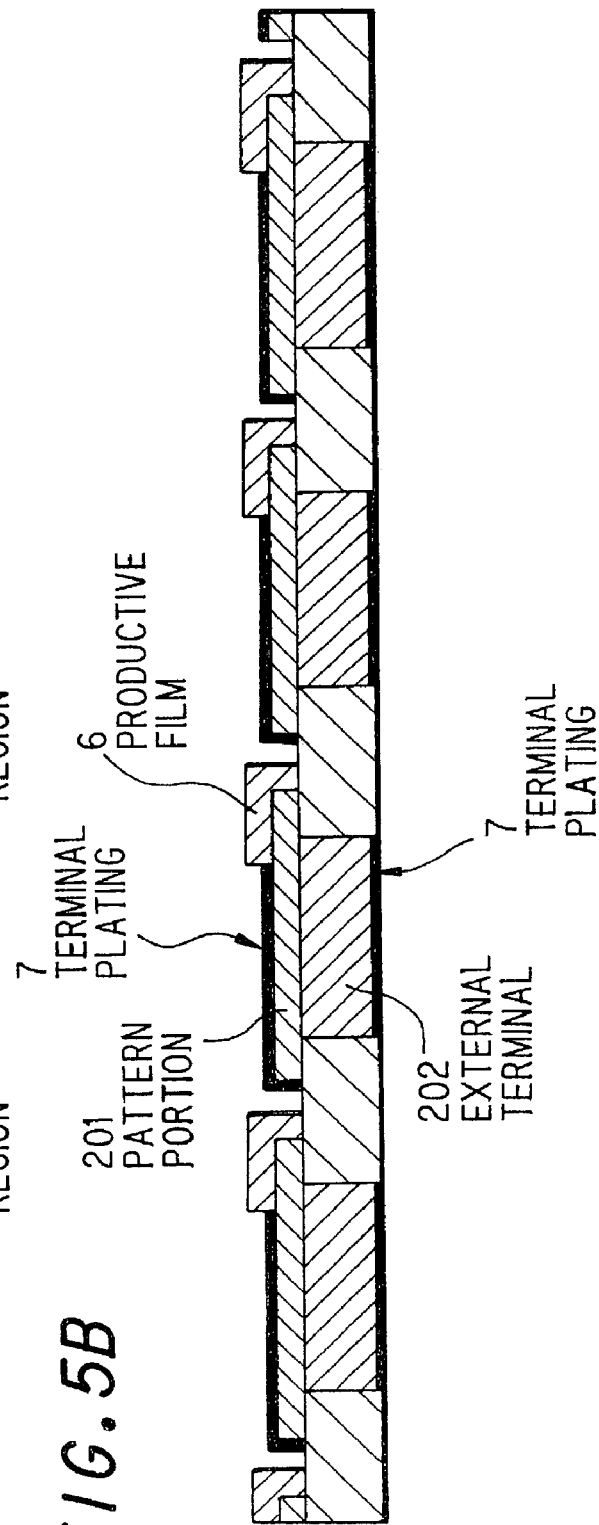
FIG. 5A
FIG. 5B

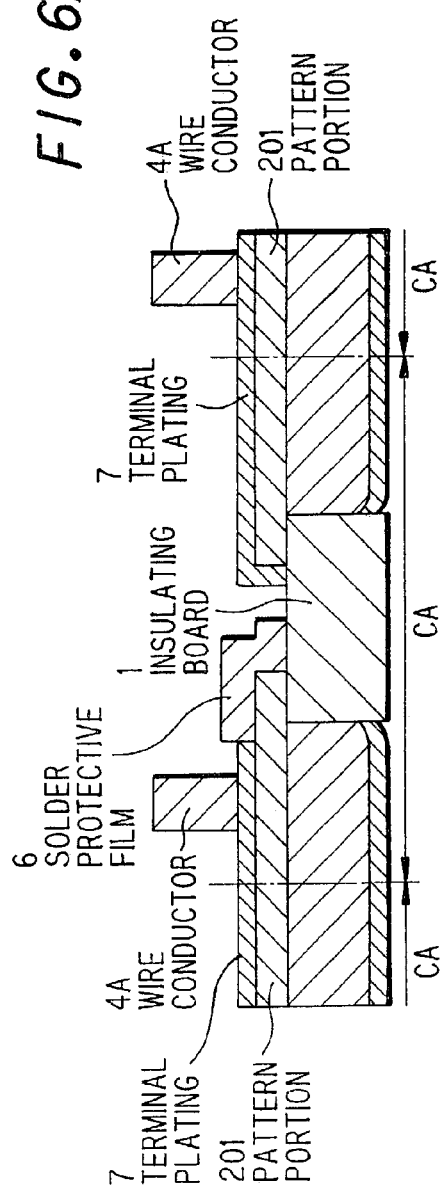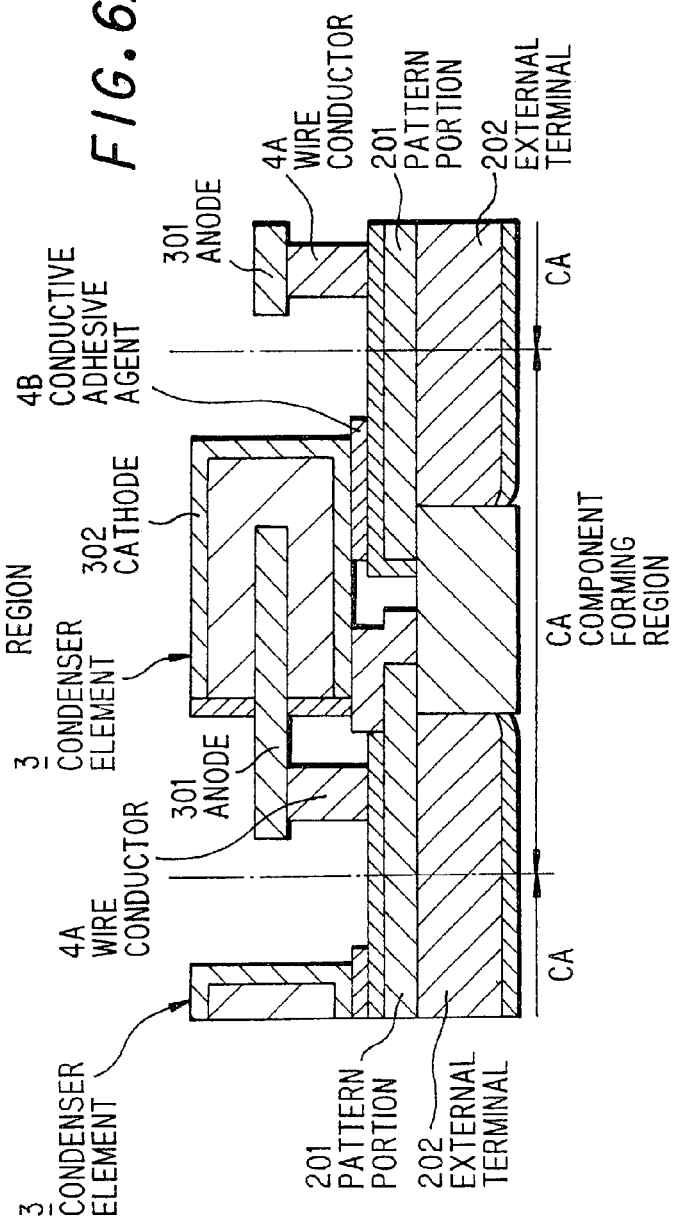

WIRING BOARD, METHOD FOR MANUFACTURING WIRING BOARD AND ELECTRONIC COMPONENT USING WIRING BOARD

BACKGROUND OF THE INVENTION

1. Field of the Invention

The present invention relates to a wiring board, method for manufacturing a wiring board and an electronic component using a wiring board, and more specifically to a wiring board, method for manufacturing a wiring board and an electronic component using a wiring board that can provide a small and thin passive component such as solid condenser, resistor, coil, transistor or so on.

2. Prior Art

Up to now, a passive component such as capacitor or resistor together with a semiconductor chip such as CPU (Central Processing Unit) or memory has been used in an electronic equipment, and an electronic component using a chip type condenser element has been used as the capacitor. A tantalum solid electrolytic condenser element is mentioned as an example of a chip type condenser element.

A tantalum solid electrolytic condenser element is provided with an anode formed by a porous sintering body manufactured by sintering high purity tantalum powder in high temperature and high vacuum atmosphere, and a dielectric formed by a tantalum pentoxide synthesized electrochemically in acidic medium. Further, a cathode is formed by a low resistivity solid electrolytic layer such as manganese dioxide or conductive polymer, a carbon layer and a silver layer.

Since a tantalum solid electrolytic condenser element has large electrode area by using a porous anode, it is suitable for miniaturization and enlarging capacity of components. Further it has excellent alternating characteristic and high reliability by using a solid electrolyte as a cathode. Therefore, a chip type condenser using a tantalum solid electrolytic condenser element has been used as a capacitive component of a mobile communication equipment such as a portable telephone or a portable electronic equipment such as a notebook personal computer requiring small size, thin shaping, high frequency and large electric current capacity.

Moreover, a chip type condenser was formed by connecting a tantalum solid electrolytic condenser element on a lead frame and encapsulating around the tantalum solid electrolytic condenser element with resin. However, it becomes difficult to increase a static capacitance comparing with external size because of recent miniaturization and thin shaping of electronic equipment. To solve these problems, a chip type condenser which does not use lead frame is proposed by Japanese unexamined patent publication number 08-148386 or 2001-307946.

A chip type condenser mentioned in Japanese unexamined patent publication number 08-148386 comprising, as shown in FIG. 1, a condenser element 3 provided with a anode 301, cathode 302 and dielectric 303, an insulating board 1 provided with a first supporting portion 1B supporting the anode 301 of the condenser element 3, a second supporting portion 1C supporting the cathode 302 of the condenser element 3, and a first external terminal 9 and a second external terminal 10 formed respectively on bottom of the first supporting portion 1B and the second supporting portion 1C and connected respectively with the anode 301 and the cathode 302 through conductive substance 11 and 12, and a case 13 covering main portion including the condenser element 3 supported by the insulating board 1.

A chip type condenser mentioned in Japanese unexamined patent publication number 2001-307946 using, as shown in FIG. 2, a stereoscopic wiring board provided with recessed portion 14 and stepped portion 15. The stepped portion 15 is formed by the insulating board 1 and resin 23, 25 laminated both sides of the insulating board 1. The recessed portion 14 is a portion where the condenser element 3 is mounted. Upon the stepped portion 15, a conductor 16 used as an anode is provided, and corresponding to the conductor 16 an anode terminal 17 is provided on the rear surface of the stereoscopic wiring board. A conductive layer 18 used for cathode is provided on the bottom surface of the recessed portion 14, and corresponding to the conductive layer 18 a cathode terminal 19 is provided on the bottom of the stereoscopic wiring board. The conductor 16 used as an anode and the anode terminal 17 are connected by a conductor 20 provided within a connecting hole 24, and the conductive layer 18 used as a cathode and the cathode terminal 19 are connected by a connecting hole 27. Numeral 26 denotes resin filled in the connecting hole 24.

Further, the condenser element 3 is mounted to the recessed portion 14, and the anode 301 is placed on the stepped portion 15 and connected to the conductor 16 used as an anode. The cathode 302 is connected with the conductive layer 18 used as a cathode through conductive adhesive agent 4B.

However, in the conventional wiring board used for the chip type condenser, the external terminal is provided on the bottom of the insulating board, namely on the side bottom of the plane where the condenser element is connected, and the external terminal is connected with the anode and cathode of the condenser element through the conductor formed within the through hole provided to the insulating board.

Plating or filling a conductive resin is considered as a method for forming the conductor within the through hole provided to the insulating board, but it becomes difficult to fill conductive material within the through hole, because diameter of the through hole is getting small according to recent miniaturization of chip type condenser. Accordingly, conductive imperfection is apt to occur due to imperfect filling of conductive material within the through hole.

Further, since conductive imperfection is apt to occur within the through hole, miniaturization of the chip type condenser becomes difficult because of difficulty of further miniaturization of the wiring board.

In a chip type condenser mentioned in Japanese unexamined patent publication number 08-148386, forming of conductive substance 11, 12 within the through hole 11A, 12A is difficult, because the depth of the anode 301 side through hole 1A is different from the depth of the cathode 302 side through hole 12A.

Further, in a chip type condenser mentioned in Japanese unexamined patent publication number 08-148386 and 2001-307946, since the stepping portion is formed to connect the anode of the condenser element and the conductor used as an anode on the insulating board, manufacturing cost is risen by increasing manufacturing process of the wiring board for use in the chip type condenser.

SUMMARY OF THE INVENTION

An object of the present invention is to provide a wiring board which realizes a small and thin passive component such as chip type condenser connected with condenser element.

Another object of the present invention is to provide a wiring board which can be manufactured easily to form passive component such as chip type condenser connected with condenser element.

Another object of the present invention is to provide a wiring board which can decrease manufacturing process and reduce manufacturing cost to form passive component such as chip type condenser connected with condenser element.

Another object of the present invention is to provide a small and thin electronic component which is mounted not only a condenser element but also a passive component such as a resistor and coil with decreased manufacturing process and reduced manufacturing cost.

In accordance with this invention, there is provided a wiring board which forms an electronic component by mounting a passive element, comprising an insulating board provided with an opening having predetermined pattern, a wiring formed with predetermined pattern on said insulating board, and an external terminal filled to said opening, connected with said wiring by said filling, and exposed to a bottom of said insulating board where said wiring is formed.

According to the above constitution, since the external terminal is embedded in the insulating board and is exposed to a bottom of the insulating board where the wiring pattern is formed, forming of the wiring pattern on both sides of the insulating board becomes unnecessary. Therefore, thin wiring board and thin electronic equipment can be obtained.

Further, since the external terminal is embedded in the insulating board, forming of through hole having small diameter becomes unnecessary, therefore, a wire board can be manufactured easily. Further more, since forming of through hole having small diameter becomes unnecessary and the external terminal is connected directly with the wiring pattern, conductive imperfection between the external terminal and the wiring pattern becomes difficult to arise. Therefore, small wiring board can be obtained.

It is preferable to form the external terminal using low resistivity metal substance to prevent lowering of electrical characteristic. Specifically, copper, nickel, gold, silver, tin or alloy thereof is preferable.

If electrical characteristic is not influenced, the external terminal may be formed by a conductive resin instead of metal substance. When the conductive resin is used, resistivity increases comparing with the metal substrate, but because difference of coefficient of thermal expansion between conductive resin and the insulating board is small, peeling of the external terminal from the insulating board becomes difficult to arise.

Generally, plating film of soldering adhesive substance is formed frequently on the exposed surface of the external terminal to mount chip type condenser on the wiring board. At this time, considering environments, it is preferable to form the plating film using lead free soldering adhesive substance such as tin, tin-silver alloy, tin-copper alloy, tin-bismuth alloy or tin-zinc alloy.

Since the insulating board has many component forming regions, after forming many components to the component forming regions together, cut off the insulating board to make into the separate body, an area of the bottom of the opening portion can be widen by forming the opening to step over adjacent two component regions, the external terminal can be formed easily. Therefore, conductive imperfection becomes difficult to arise, reliable wiring board can be obtained.

In accordance with this invention, there is provided a method for manufacturing a wiring board which forms an electronic component by mounting a passive element on an insulating board, comprising a process to form a conductive film on a surface of said insulating board, a process to form an opening on a predetermined portion of said insulating board, a process to form an external terminal of a wiring by filling a conductive substance within said opening of said insulating board, and a process to form a wiring having predetermined pattern by removing unnecessary portion of said conductive film.

According to the above constitution, since the external terminal is formed by filling the conductive substance in the opening of the insulating board, manufacturing process can be decreased comparing with conventional method which forms the wiring pattern on both sides of the insulating board. Therefore, manufacturing cost of the wiring board can be reduced.

Further, since an area of the bottom of the opening portion of the insulating board become almost same as the external terminal, an area of the opening portion becomes wider comparing with the conventional hole diameter of the through hole which maintains conduction between surface and bottom of the insulating board, therefore, filling of conductive substance becomes easy.

At this time, the external terminal can be formed easily by filling the opening of the insulating board with copper, nickel, gold, silver, tin or alloy thereof by using electrolytic plating.

Further, when an area of the opening is wide enough, conductive resin may be filled in the opening of the insulating board by printing and cure thereafter instead of forming by electrolytic plating.

Generally, after forming of the wiring pattern, soldering adhesive substance is formed on the surface of the pattern and the external terminal. At this time, considering environments, it is preferable to use lead free soldering adhesive substance such as tin, tin-silver alloy, tin-copper alloy, tin-bismuth alloy or tin-zinc alloy.

Since the insulating board has many component forming regions, after forming many components to the component forming regions together, cut off the insulating board to make into the separate body, an area of the bottom of the opening portion can be widen by forming the opening to step over adjacent two component regions, the external terminal can be formed easily. At this time, the external terminal is cut off and make into the external terminal of respective electronic component.

In accordance with this invention, there is provided an electronic component formed by mounting a passive element, comprising a wiring board comprising, an insulating board provided with an opening having predetermined pattern, a wiring formed with predetermined pattern on said insulating board, and an external terminal filled to said opening, connected with said wiring by said filling, and exposed to a bottom of said insulating board where said wiring is formed, a passive element formed on said wiring board, a conductive article connecting electrically between said wiring and said passive element, and an insulator encapsulating around said passive element.

According to the above constitution, small and thin wiring board can be obtained easily, therefore, small electronic equipment can be obtained easily.

It is preferable to form the external terminal using low resistivity metal substance to lower contact resistance between the external terminal and the wiring pattern, and to improve operating characteristic of electronic equipment. Specifically, copper, nickel, gold, silver, tin or alloy thereof is preferable.

Further, by forming solid condenser, resistor, coil or transistor on the insulating board with combination of substance and shape of a wiring, small electronic equipment can be obtained, therefore, small and light weight portable electronic equipment can be obtained.

BRIEF DESCRIPTION OF THE DRAWINGS

The invention will be explained in more detail in conjunction with the appended drawings, wherein:

FIG. 4(a) is a cross sectional view showing a process of forming an opening portion for use in an external terminal.

FIG. 4(b) is a cross sectional view showing a process of forming an external terminal.

FIG. 5(a) is a cross sectional view showing a process of forming a pattern portion.

FIG. 5(b) is a cross sectional view showing a process of forming a solder protective film and an electrode plating.

FIG. 6(a) is a cross sectional view showing a process of forming a wire conductor on a wiring board.

FIG. 6(b) is a cross sectional view showing a process of mounting a condenser element.

DESCRIPTION OF THE PREFERRED EMBODIMENTS

Preferred embodiments of the present invention will be explained in conjunction with accompanying drawings.

Figure 1:
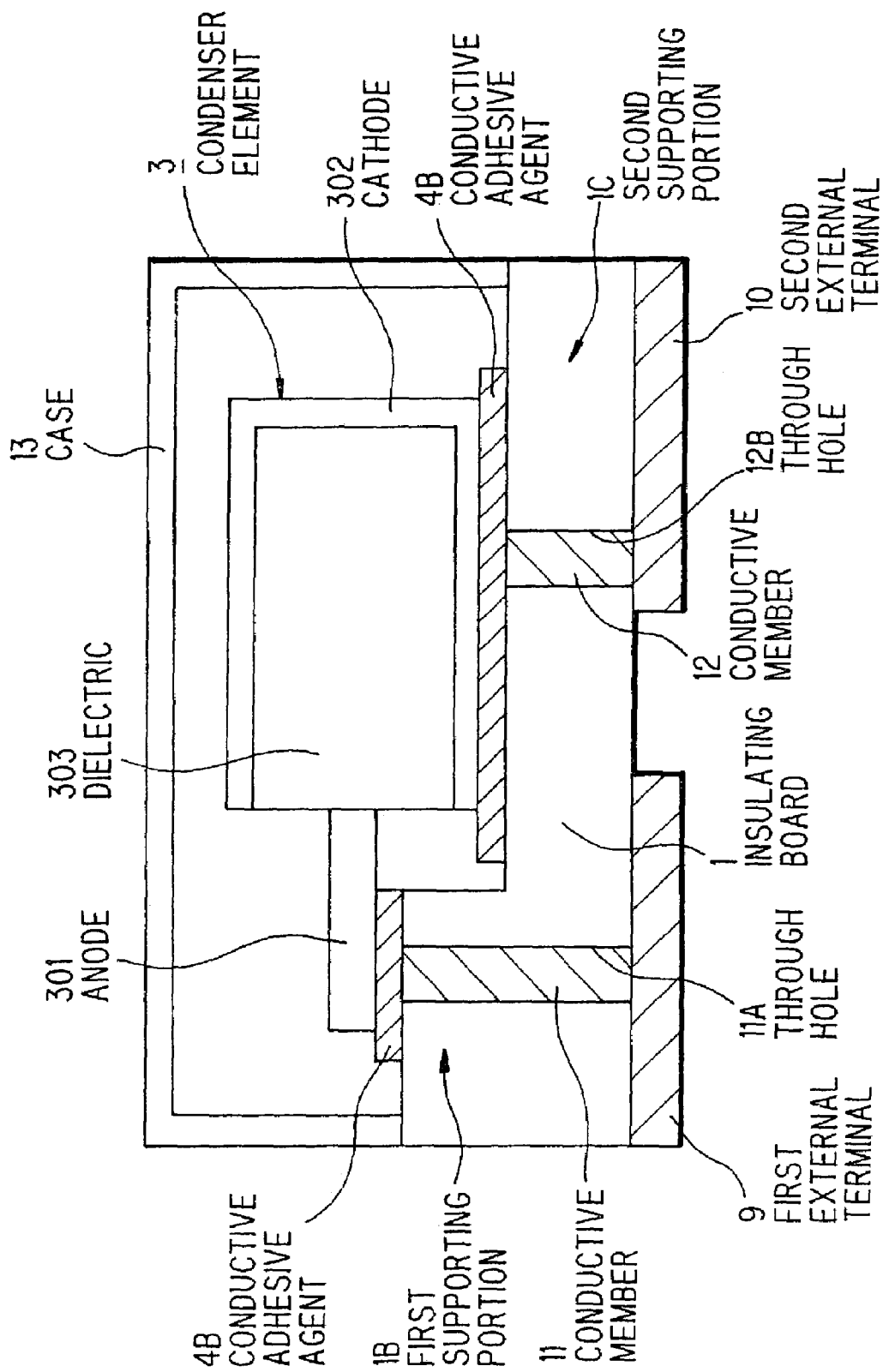
FIG. 1 is a cross sectional view showing a conventional chip type condenser.
Figure 2:
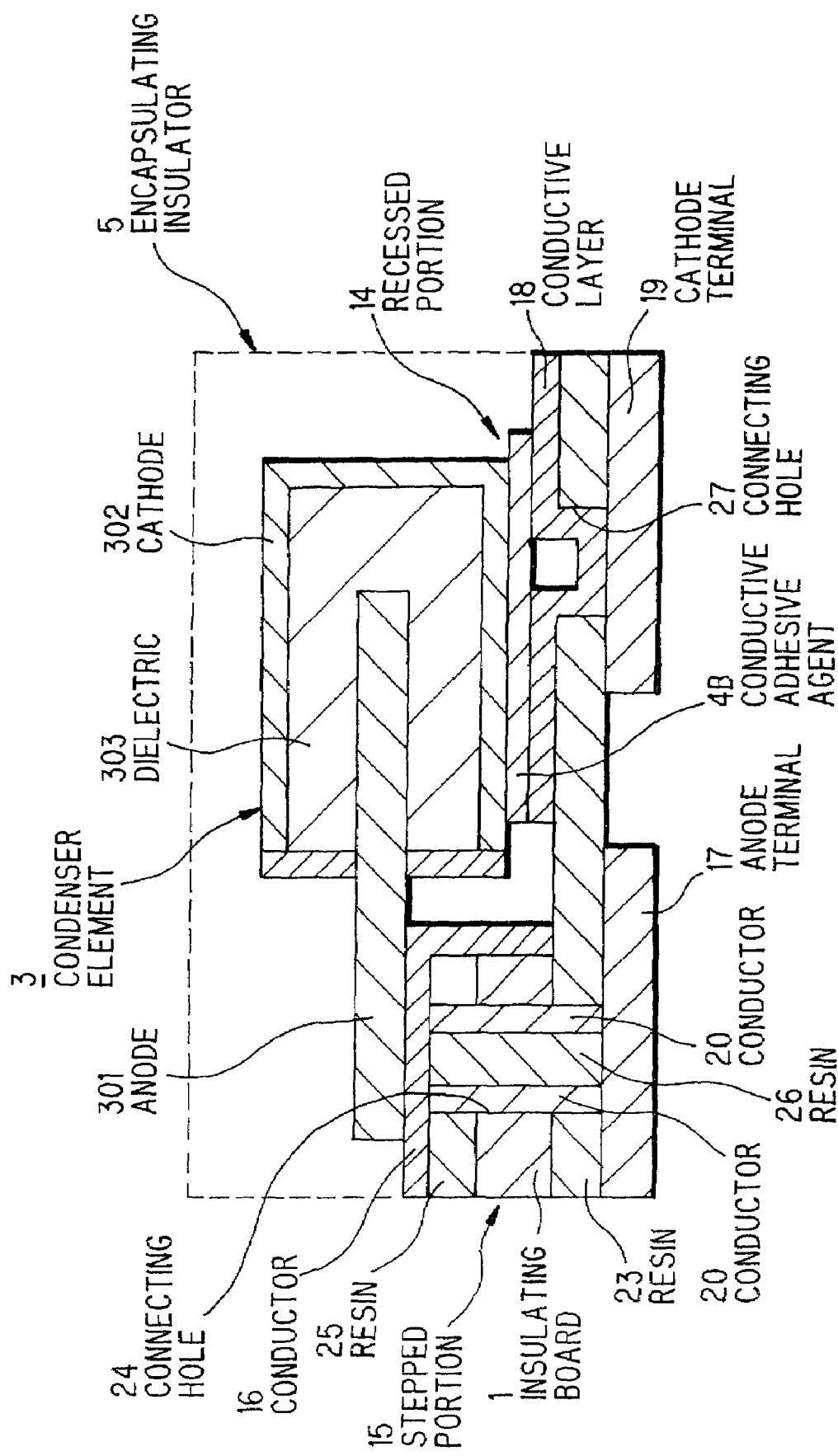
FIG. 2 is a cross sectional view showing a conventional chip type condenser.
Figure 3A:
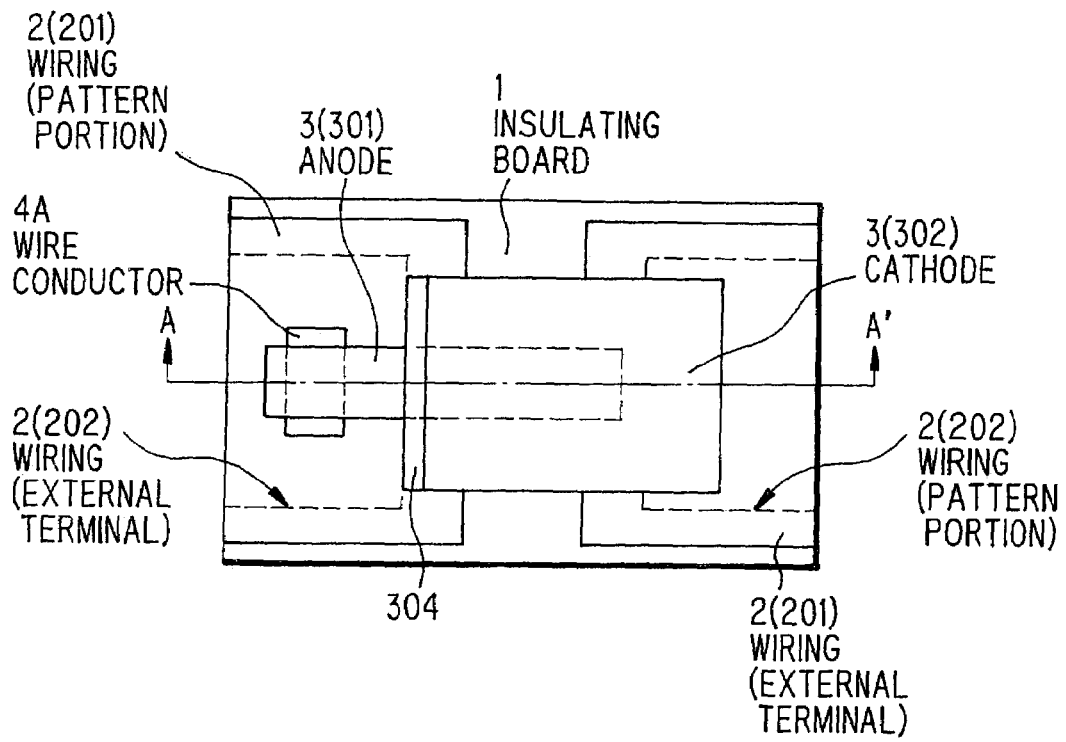
FIG. 3(a) is a plane view showing a chip type condenser applied wiring board in accordance with an embodiment of the present invention.
Figure 3B:
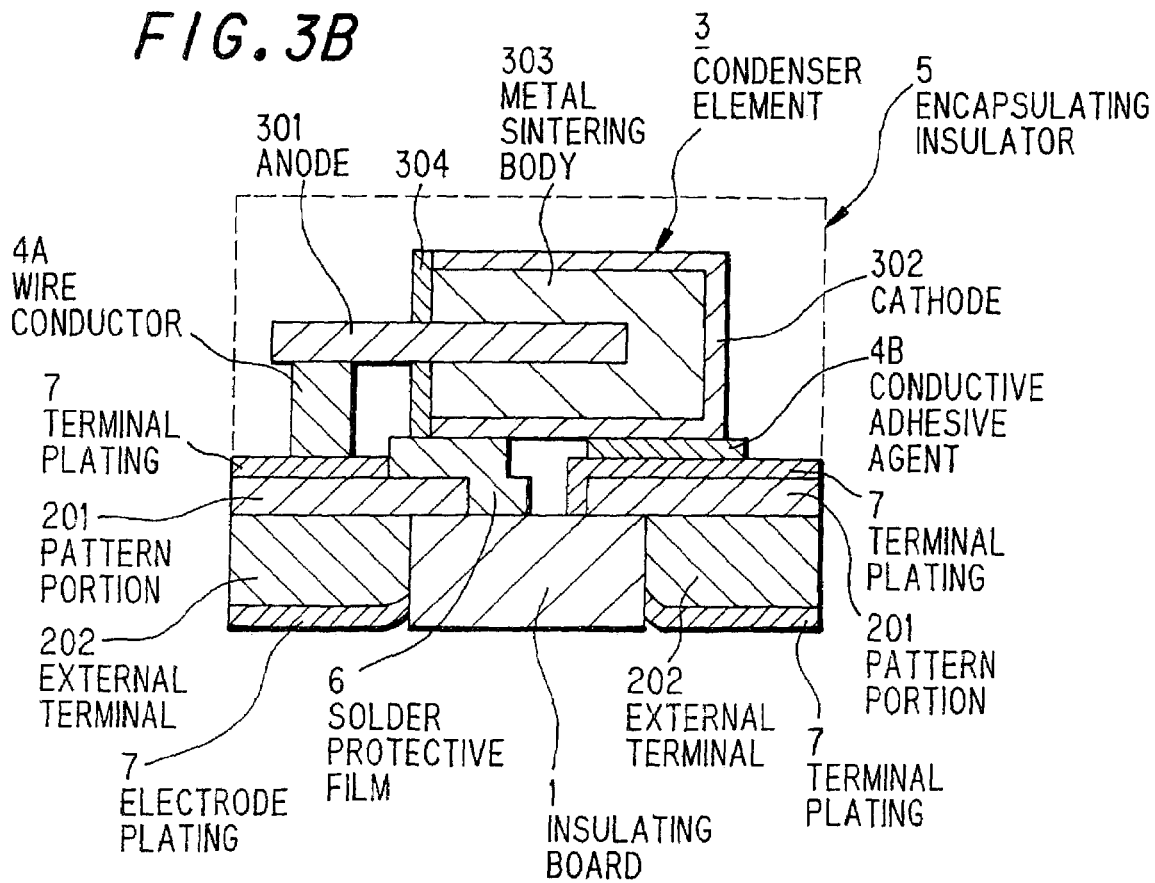
FIG. 3(b) is a cross sectional view along A-A' line of FIG. 3(a).

FIG. 3(a) is a plane view showing a chip type condenser applied a wiring board in accordance with an embodiment of the present invention, and FIG. 3(b) is a cross sectional view along A-A' line of FIG. 3(a). In FIG. 3(a) and FIG. 3(b), a concrete construction of an encapsulating insulator is abbreviated.

In FIG. 3(a) and FIG. 3(b), numeral 1 denotes an insulating board, numeral 2 denotes a wiring, numeral 201 denotes a pattern portion, numeral 202 denotes an external terminal, numeral 3 denotes a condenser element (tantalum solid electrolytic condenser element), numeral 301 denotes an anode, numeral 302 denotes a cathode, numeral 303 denotes a metal sintering body (dielectric), numeral 4A denotes a wire conductor, numeral 4B denotes a conductive adhesive agent, numeral 5 denotes an encapsulating insulator, numeral 6 denotes a solder protective film (solder resist) and numeral 7 denotes a terminal plating.

A chip type condenser applied a wiring board in accordance with an embodiment of the present invention comprising, as shown in FIG. 3(a) and FIG. 3(b), the wiring board provided with the wiring (conductor pattern) 2 on the insulating board 1, the condenser element 3 provided on the wiring board (insulating board 1), the wire conductor 4A connecting electrically between the wire 2 and the anode 301 of the condenser element 3, the conductive adhesive agent 4B connecting electrically between the wire 2 and the cathode 302 of the condenser element 3, and the encapsulating insulator encapsulating around the condenser element 3.

As shown in FIG. 3(b), the wiring 2 comprising the pattern portion 201 provided on the surface of the insulating board 1, and the external terminal 202 embedded in the insulating board 1 and exposed to the bottom of the plane where the pattern portion 201 is formed. The external terminal 202 is formed, for example, by electro cupper plating.

The solder protective film (solder resist) 6 is provided on the predetermined region of the pattern portion 201 of the wiring 2, and the terminal plating 7 is provided on the pattern portion 201 and on the exposing plane of the external terminal 202. The electrode plating 7 is formed by the lead (Pb) free metal material such as tin (Sn), tin (Sn)—silver (Ag) alloy, tin (Sn)—copper (Cu) alloy, tin (Sn)—bismuth (Bi) alloy or tin (Sn)—zinc (Zn) alloy.

In the chip type condenser applied the wiring board in accordance with the embodiment of the present invention, the condenser element 3 is, for example, tantalum solid electrolytic condenser element comprising, the anode 301 formed by tantalum porous sintering body, the cathode formed by the solid electrolytic layer such as manganese dioxide or conductive polymer, the carbon layer and the silver layer, and the metal sintering body (dielectric) 303 formed by a tantalum pentoxide synthesized electrochemically in acidic medium.

FIG. 4(a), FIG. 4(b), FIG. 5(a) and FIG. 5(b) are explanatory view showing manufacturing process of the wiring board for use in the chip type condenser applied wiring board in accordance with the embodiment of the present invention. FIG. 4(a) is a cross sectional view showing a process of forming a opening portion for use in the external terminal, FIG. 4(b) is a cross sectional view showing a process of forming the external terminal, FIG. 5(a) is a cross sectional view showing a process of forming the pattern portion, and FIG. 5(b) is a cross sectional view showing a process of forming the solder protective film and the electrode plating.

The wiring board for use in the chip type condenser applied the wiring board in accordance with the embodiment of the present invention can be manufactured by the same process as a wiring board (tape carrier) for use in a manufacture of TCP (Tape Carrier Package), for example, the wiring (conductor pattern) is formed on a tape insulating board by utilizing reel to reel method. The method will be explained as follows.

As shown in FIG. 4(a), a tape material formed by providing a conductive film 8 on either surface of the tape insulating board 1 is prepared, then the opening portion 1A to form the external terminal is formed at predetermined portion of the tape material. A polyimide tape is used as the insulating board 1, and a rolled copper foil or an electrolytic copper foil is used as the conductive film 8.

The opening portion 1A is formed by laser processing using carbon dioxide gas laser or excimer laser. The insulating board 1 is long to one direction, and is provided with region (component forming region) where a plurality of chip type condensers are equipped. The opening portion 1A is formed, for example shown in FIG. 4(a), to step over two adjacent component forming regions CA1, CA2.

Instead of forming the opening portion 1A to the tape material provided with the conductive film 8, a method that the opening portion 1A is formed previously to the insulating board 1 by metal mold punch processing, then adhere the conductive film 8 on either surface of the insulating board 1 may be adopted.

Next, as shown in FIG. 4(*b*), the external terminal 202 of the wiring 2 is formed by filling copper within the opening portion 1A, for example by a means of electric copper plating utilizing the conductive film 8 as a cathode. The external terminal 202 is formed to fill sufficiently the opening portion 1A but not project out the insulating board 1. At this time, not shown in the figure, the surface of the conductor film 8 is covered by the resist.

The opening portion 1A of the insulating board 1 is formed to step over adjacent two component forming regions CA1, CA2, and the bottom of the opening portion 1A has an area of twice of the external terminal, therefore the plating liquid enter easily to the opening portion 1A, and the external terminal 202 can be formed easily.

Next, as shown in FIG. 5(*a*), the pattern portion 201 of the wiring 2 is formed by etching and removing unnecessary portion of conductive film 8. The pattern portion 201 is formed such pattern that, for example as shown in FIG. 5(*a*), step over adjacent two component forming regions CA1, CA2, one end is connected with the cathode of condenser element of the first component forming region CA1, and another end is connected with the anode of the condenser element of the second component forming region CA2. The pattern is not limited to shown in FIG. 5(*a*), forming of independent wiring in the component forming region CA1, CA2 respectively is possible.

Next, as shown in FIG. 5(*b*), the solder protective film 6 is formed on the predetermined portion of the pattern portion 201 of the wiring, then the electrode plating 7 is formed on the exposed plane of the pattern portion 201 and the external terminal 202. It is preferable to form the electrode plating 7 by for example tin (Sn), tin (Sn)—silver (Ag) alloy, tin (Sn)—copper (Cu) alloy, tin (Sn)—bismuth (Bi) alloy or tin (Sn)—zinc (Zn) alloy.

In the wiring board for use in the chip type condenser of this embodiment manufactured in accordance with above explained process, since the external terminal 202 is formed embedded in the insulating board 1, an area of the bottom of the opening portion 1A of the insulating board 1 become wider comparing with the conventional hole diameter of the through hole which maintains conduction between surface and bottom of the insulating board, therefore the external terminal 202 can be formed easily. Further, since the pattern portion 201 is formed on only either surface of the insulating board 1, manufacturing process is decreased comparing with conventional method which forms pattern on both sides, therefore, manufacturing cost can be reduced.

FIG. 6(*a*) and FIG. 6(*b*) are explanatory view showing manufacturing process of the chip type condenser applied wiring board in accordance with the embodiment of the present invention. FIG. 6(*a*) is a cross sectional view showing a process of forming a wire state conductor on the wiring board and FIG. 6(*b*) is a cross sectional view showing a process of mounting the condenser element.

To form the chip type condenser using the wiring board in accordance with the process as explained showing FIG. 4(*a*), FIG. 4(*b*), FIG. 5(*a*) and FIG. 5(*b*), first of all, for example as shown in FIG. 6(*a*), the wire conductor 4A is formed on the portion of the component forming region CA where the anode 301 of the condenser element 3 is connected. The wire conductor 4A is formed, for example, by printing or coating conductive paste such as silver (Ag) paste.

Next, the conductive adhesive agent 4B is coated on the portion of the component forming region CA where the cathode 302 of the condenser element 3 is connected, and as shown in FIG. 6(*b*), the condenser element 3 is mounted and adhered on the component forming region CA.

After that, not shown in the figure, the condenser element 3 is encapsulated by, for example, coating and curing the encapsulating insulator 5 such as thermosetting resin over the surface where the condenser element 3 is adhered, then cutting off the boundary of each component forming region CA and make into the separate body, the chip type condenser, shown in FIG. 3(*a*) and FIG. 3(*b*) can be obtained. At this time, both the pattern portion 201 of the wiring 2 and the external terminal 202 which are formed to step over adjacent two component forming regions CA are cut off and made to individual component.

As described above in detail, according to the wiring board of this embodiment, in forming the wiring board for use in the chip type condenser, since the external terminal 202 is formed embedded in the insulating board 1, an area of the bottom of the opening portion 1A of the insulating board 1 become wider comparing with the conventional hole diameter of the through hole which maintains conduction between surface and bottom of the insulating board, therefore the external terminal 202 can be formed easily. Further, since the external terminal 202 can be formed easily, conductive imperfection becomes difficult to arise.

Further, the opening portion 1A to form the external terminal 202 is formed to step over adjacent two component forming regions CA1, CA2, an area of the bottom of the opening portion becomes wider, therefore the external terminal 202 can be formed easily, and conductive imperfection becomes difficult to arise.

Furthermore, an area of the bottom plane of the opening portion 1A to one component forming region become wider, the external terminal 202 can be formed easily, even if the wiring board is miniaturized, the external terminal 202 can be formed easily. Accordingly, and thin wiring board can be obtained easily comparing with conventional wiring board, therefore, small and thin electronics equipment can be obtained easily.

Further more, by embedding the external terminal 202 in the insulating board 1, the pattern portion 201 is formed on only either surface of the insulating board 1. Therefore, manufacturing process can be decreased and manufacturing cost can be reduced comparing with conventional method which forms wiring pattern on both sides of the wiring board 1.

Further more, by using wire state conductor 4A connecting between the wiring 2 and the anode 301 of the condenser element 3, the manufacture of the wiring board becomes easily, and manufacturing cost can be reduced, because forming the stepping portion becomes unnecessary.

Further more, by forming lead (Pb) free terminal plating 7 such as tin (Sn), tin (Sn)—silver (Ag) alloy, tin (Sn)—copper (Cu) alloy, tin (Sn)—bismuth (Bi) alloy or tin (Sn)—zinc (Zn) alloy on the pattern portion 201 of the wiring 2 and the surface of the external terminal 202.

Although the invention has been described with respect to the chip type condenser applied wiring board of the embodiment, the invention is not limited to the embodiments but is to be construed as embodying all modification and alternative constructions.

For example, in the chip type condenser applied wiring board according to the embodiment of the invention, a tantalum solid electrolytic condenser element 3 is used as a chip state passive element, but not limited to this, by forming electronic component using various kind of passive element, the same effect can be achieved as explained in the chip type condenser applied wiring board according to the embodiment of the invention.

Further, in the chip type condenser applied wiring board according to the embodiment of the invention, the external terminal 202 is formed by electric copper plating, but not limited to this, for example, nickel (Ni), gold (Au), silver (Ag) or tin (Sn) can be used, and can be formed by filling conductive paste by printing method.

Further more, in the chip type condenser applied wiring board according to the embodiment of the invention, the condenser element 3 is mounted after forming wire conductor 4A on the wiring board as shown in FIG. 6(*a*), but not limited to this, for example, the condenser element 3 provided with the conductor 4A which is formed previously on the anode 301 may be mounted.

Figure 7A:
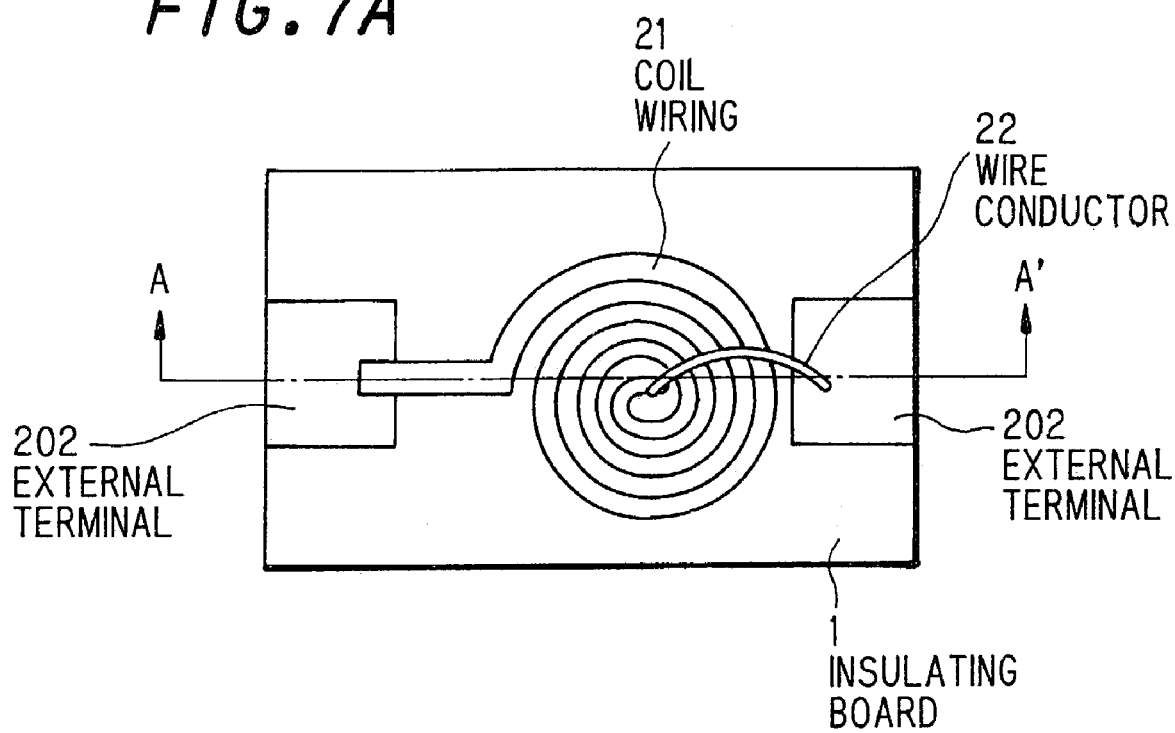
FIG. 7(a) is a plane view showing a wiring board mounted with a coil.
Figure 7B:
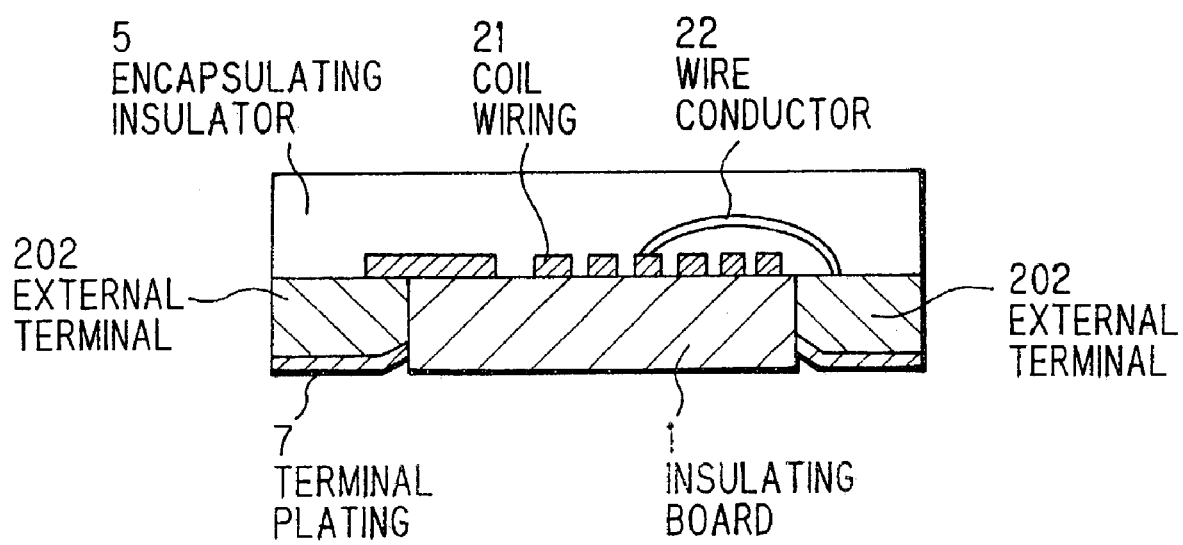
FIG. 7(b) is a cross sectional view along A-A' line of FIG. 7(a).

FIG. 7(*a*) and FIG. 7(*b*) are explanatory view showing a wiring board mounted with a coil for use in an inductance element in accordance with an embodiment of the present invention. FIG. 7(*a*) is a plane view showing a coil and FIG. 7(*b*) is a cross sectional view along A-A' line of FIG. 7(*a*). In FIG. 7(*a*) and FIG. 7(*b*), numeral 1 denotes an insulating board, 202 denotes an external terminal, numeral 21 denotes a coil wiring, numeral 22 denotes a wire conductor (gold wire), numeral 5 denotes an encapsulating insulator, and numeral 7 denotes a electrode plating. This wiring board comprising, as shown in FIG. 7(*a*) and FIG. 7(*b*), the coil wiring 21 provided on the insulating board 1, the wire conductor 22 connecting electrically between one end of the coil wiring 21 and the external terminal 202, the external terminal 202 connected with other end of the coil wiring 21, and the encapsulating insulator 5 encapsulating around the coil wiring 21.

As shown in FIG. 7(*b*), the wiring board comprising the wiring pattern such as coil wiring 21 provided on the surface of the insulating board 1, and the external terminal 202 embedded in the insulating board 1 and exposed to the rear plane of the surface where the wiring pattern is formed. The external terminal 202 is formed, for example, by electro cupper plating.

The electrode plating 7 is provided on the exposing surface of the external terminal 202. The electrode plating 7 is formed by lead (Pb) free metal material such as tin (Sn), tin (Sn)—silver (Ag) alloy, tin (Sn)—copper (Cu) alloy, tin (Sn)—bismuth (Bi) alloy or tin (Sn)—zinc (Zn) alloy.

The wiring board for use in the coil applied wiring board in accordance with the embodiment of the present invention can be manufactured by the same process as a wiring board (tape carrier) for use in a manufacture of TCP (Tape Carrier Package), for example, the wiring (conductor pattern) is formed on a tape insulating board by utilizing reel to reel method. The method will be explained as follows.

As shown in FIG. 4(*a*), a tape material formed by providing a conductive film 8 on either surface of the tape insulating board 1 is prepared, then the opening portion 1A for use in the external terminal is formed at predetermined portion of the tape material. A polyimide tape is used as the insulating board 1.

The opening potion 1A is formed by laser processing using carbon dioxide gas laser or excimer laser. Instead of forming the opening portion 1A to the tape material provided with the conductive film 8, it is possible that the opening portion 1A is formed previously to the insulating board 1 by metal mold punch processing, then adhere the conductive film 8 on either surface of the insulating board 1. The external terminal 202 of the coil wiring 21 is formed by filling copper within the opening portion 1A, for example, by a means of electric copper plating utilizing the conductive film 8 as a cathode. The external terminal 202 is formed to fill sufficiently the opening portion 1A but not project out the insulating board 1. At this time, the surface of the conductor film 8 is covered by the resist. Later, the electrode plating 7 is formed on the exposed plane of the external terminal 202. It is preferable to form the electrode plating 7 by for example tin (Sn), tin (Sn)—silver (Ag) alloy, tin (Sn)—copper (Cu) alloy, tin (Sn)—bismuth (Bi) alloy or tin (Sn)—zinc (Zn) alloy.

Next, the coil wiring 21 is formed by etching and removing unnecessary portion of the conductive film 8. The either end of the coil wiring 21 is connected with the external terminal 202, and the other end of it is connected with the other external terminal 202 through the wire conductor (gold wire) 22. After encapsulating the plane where the coil wiring 21 is formed, make into the separate body by cutting off.

As described above, since the wiring board mounted with a coil for use in an inductance element in accordance with the embodiment of the present invention can be obtained by etching the conductor film 8 formed on the insulating board 1, mounting process of a separately manufactured coil component becomes unnecessary, therefore, small and thin coil can be obtained easily.

This invention is not limited to the above embodiments but is applicable to various modifications. For example, a passive element may be formed directly on a insulating board by combination of substance and shape of a wiring. Namely, a small size under plate electrode type transistor can be obtained by mounting a transistor element on an insulating board and encapsulating the transistor element with an insulator. Further, a small size under plate electrode type resistor can be obtained by mounting a resistor element on an insulating board, connecting both ends of the resistor element to external terminal, and encapsulating the resistor element with an insulator.

Since a wiring board according to this invention comprising, a wiring formed on insulating board having opening, and an external terminal connected with the wiring by embedded in a opening and exposed to a rear plane of an insulating board on which the wiring is formed, following effects can be obtained.

(1) A wiring board which realize small and thin passive component such as chip type condenser connected with a condenser element can be obtained.

(2) A wiring board which can be manufactured easily to form a passive component such as chip type condenser connected with a condenser element can be obtained.

(3) A wiring board which can decrease manufacturing process and reduce manufacturing cost to form a passive component such as chip type condenser connected with a condenser element can be provided.

(4) Since a coil can be obtained by etching a conductor film formed on an insulating board, mounting process of a separately manufactured coil component becomes unnecessary, therefore, a small and thin electronic component such as coil can be manufactured easily.

Although the invention has been described with respect to specific embodiment and clear disclosure, the appended claims are not to be thus limited but are to be construed as embodying all modification and alternative constructions that may be occurred to one skilled in the art which fairly fall within the basic teaching herein set forth.

What is claimed is:

1. A wiring board, comprising:
   an insulating board provided with an opening having a predetermined pattern;

a wiring pattern formed with a predetermined pattern on said insulating board; and a filling member filled in said opening and connected with said wiring pattern, wherein said filling member defines an external terminal at a bottom surface of said insulating board, said opening has a bottom area nearly equal to that of said external terminal, and said wiring pattern is formed only on a top surface of the insulating board;

wherein said wiring board further comprises a passive element mounted thereon, said passive element comprising at least one selected from the group consisting of a solid condenser, a resistor, and a coil.

2. A wiring board according to claim 1, wherein:
said external terminal is of at least one selected from copper, nickel, gold, silver and tin or alloy thereof.

3. A wiring board according to claim 1, wherein:
said external terminal is of conductive resin.

4. A wiring board according to claim 1, wherein:
an exposed portion of said external terminal is covered with plating film of at least one selected from tin, tin-silver alloy, tin-copper alloy, tin-bismuth alloy and tin-zinc alloy.

5. An electronic component comprising a wiring board, wherein said wiring board comprising:

an insulating board provided with an opening having a predetermined pattern;

a wiring pattern formed with a predetermined pattern on said insulating board; and a filling member filled in said opening and connected with said wiring pattern, wherein said filling member defines an external terminal at a bottom surface of said insulating board, said opening has a bottom area nearly equal to that of said external terminal, and said wiring pattern is formed only on a top surface of the insulating board;

wherein said wiring board further comprises a passive element mounted thereon, said passive element comprising at least one selected from the group consisting of a solid condenser, a resistor, and a coil.

6. An electronic component according to claim 5, wherein:
said external terminal is of at least one selected from copper, nickel, gold, silver and tin or alloy thereof.

7. An electronic component according to claim 5, wherein:
said external terminal is of conductive resin.

8. An electronic component according to claim 5, wherein:
an exposed portion of said external terminal is covered with plating film of at least one selected from tin, tin-silver alloy, tin-copper alloy, tin-bismuth alloy and tin-zinc alloy.

9. An electronic component according to claim 5, wherein:
said wiring board further comprises a passive element mounted thereon, said passive element comprising a solid electrolytic condenser element comprising, a metal sintering body, an anode projecting to one end of said metal sintering body and a cathode provided periphery of said metal sintering body.

10. An electronic component according to claim 5, wherein:
said wiring board further comprises a passive element mounted thereon, said passive element being formed directly on said insulating board.

11. An electronic component comprising:

a wiring board comprising: an insulating board provided with an opening having a predetermined pattern; a wiring pattern formed with a predetermined pattern on said insulating board; and a filling member filled in said opening and connected with said wiring pattern, wherein said filling member defines an external terminal at a bottom surface of said insulating board, said opening has a bottom area nearly equal to that of said external terminal, and said wiring pattern is formed only on a top surface of the insulating board;

a passive element mounted on said top surface of said insulating board;

wherein said passive element comprising at least one selected from the group consisting of a solid condenser, a resistor, and a coil;

a conductive article connecting electrically between said wiring pattern and said passive element; and an insulator encapsulating around said passive element.

12. An electronic component according to claim 11, wherein:
said external terminal is of at least one selected from copper, nickel, gold, silver and tin or alloy thereof.

13. An electronic component according to claim 11, wherein:
said external terminal is of conductive resin.

14. An electronic component according to claim 11, wherein:
an exposed portion of said external terminal is covered with plating film of at least one selected from tin, tin-silver alloy, tin-copper alloy, tin-bismuth alloy and tin-zinc alloy.

15. An electronic component according to claim 11, wherein:
said passive element is a solid electrolytic condenser element comprising, a metal sintering body, an anode projecting to one end of said metal sintering body and a cathode provided periphery of said metal sintering body.

16. An electronic component according to claim 11, wherein:
said passive element is formed directly on said insulating board.

* * * * *